United States Patent
Tokuda

(10) Patent No.: US 9,360,881 B2
(45) Date of Patent: Jun. 7, 2016

(54) DRIVE CIRCUIT, INTEGRATED CIRCUIT DEVICE, AND METHOD FOR CONTROLLING CHARGE PUMP CIRCUIT

(71) Applicant: SEIKO EPSON CORPORATION, Tokyo (JP)

(72) Inventor: Yasunobu Tokuda, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/658,992

(22) Filed: Mar. 16, 2015

(65) Prior Publication Data
US 2015/0270829 A1 Sep. 24, 2015

(30) Foreign Application Priority Data
Mar. 20, 2014 (JP) .................. 2014-058593

(51) Int. Cl.
| G05F 1/00 | (2006.01) |
| H03B 19/14 | (2006.01) |
| G05F 3/08 | (2006.01) |
| H03K 19/0175 | (2006.01) |
| H02M 3/07 | (2006.01) |

(52) U.S. Cl.
CPC . *G05F 3/08* (2013.01); *H02M 3/07* (2013.01); *H03K 19/017509* (2013.01); *H02M 2003/075* (2013.01)

(58) Field of Classification Search
USPC .................. 327/113–114, 116, 122, 534–537
See application file for complete search history.

(56) References Cited

U.S. PATENT DOCUMENTS

| 5,943,290 | A | * | 8/1999 | Robinson | ............. G11C 27/024 341/122 |
| 6,703,890 | B2 | * | 3/2004 | Fukui | .................... H02M 3/073 327/534 |
| 6,967,523 | B2 | * | 11/2005 | DeMone | ................ G04G 19/04 307/110 |
| 8,269,530 | B2 | * | 9/2012 | Tao | .................... H03K 5/00006 327/116 |
| 2009/0015318 | A1 | | 1/2009 | Honda | |

FOREIGN PATENT DOCUMENTS

| JP | 2006-340436 A | 12/2006 |
| JP | 2009-021841 A | 1/2009 |

* cited by examiner

*Primary Examiner* — An Luu
(74) *Attorney, Agent, or Firm* — Oliff PLC

(57) ABSTRACT

A drive circuit includes an output circuit having an output node that outputs, to a charge pump circuit, a drive clock signal for driving the charge pump circuit. The output circuit generates the drive clock signal based on a first clock signal and a second clock signal that is a signal whose voltage level does not change in a period during which the voltage level of the first clock signal changes, and controls, based on the second clock signal, an impedance of the output node so as to be up, in a period before the voltage levels of the drive clock signal changes.

6 Claims, 5 Drawing Sheets

DRIVE CIRCUIT, INTEGRATED CIRCUIT DEVICE, AND METHOD FOR CONTROLLING CHARGE PUMP CIRCUIT

BACKGROUND

1. Technical Field

The present invention relates to a drive circuit, an integrated circuit device, and a method for controlling a charge pump circuit.

2. Related Art

A Dickson charge pump circuit is a kind of a charge pump circuit that boosts or drops DC voltage.

JP-A-2006-340436 discloses a charge pump drive circuit that reduces generation of high-frequency noise by outputting a clock pulse while blunting the waveform thereof using a constant current source.

In the charge pump drive circuit in J-PA-2006-340436, through-current that flows through an output circuit constituted by a complementary inverter circuit is not considered. Generation of through-current is not favorable since it causes an increase in current consumption or becomes a noise source.

As a method for solving this problem, JP-A-2009-21841 discloses a charge pump drive circuit in which a potential difference is provided between gate voltage of a P-channel MOSFET (metal-oxide-semiconductor field-effect transistor) and gate voltage of an N-channel MOSFET in an output circuit constituted by a complementary inverter circuit, thereby suppressing through-current that flows through the P-channel MOSFET and the N-channel MOSFET and reducing generation of high-frequency noise.

SUMMARY

The invention has been made in view of the above-described technical problem. According to some aspects of the invention, it is possible to provide a drive circuit, an integrated circuit device, and a method for controlling a charge pump circuit with which current consumption can be reduced.

The invention has been made in order to solve at least a part of the above-described problem, and can be realized as the following modes or application examples.

Application Example 1

A drive circuit according to this application example is a drive circuit including: an output circuit having an output node that outputs, to a charge pump circuit, a drive clock signal for driving the charge pump circuit. The output circuit generates the drive clock signal based on a first clock signal and a second clock signal that is a signal whose voltage level does not change in a period during which a voltage level of the first clock signal changes, and controls, based on the second clock signal, the output node so as to be in a high impedance state, in a period before a voltage level of the drive clock signal changes.

According to this application example, the output node that outputs the drive clock signal is controlled so as to be in a high impedance state, in the period before the voltage level of the drive clock signal changes. Therefore, through-current that flows through the output circuit can be reduced. Accordingly, it is possible to realize a drive circuit with which current consumption can be reduced.

Application Example 2

In the above-described drive circuit, the output circuit may control the output node so as to be in a high impedance state, in a period before or after a period during which the voltage level of the first clock signal changes.

According to this application example, the output node that outputs the drive clock signal is controlled so as to be in a high impedance state, in the period before or after the period during which the voltage level of the first clock signal changes. Therefore, through-current that flows through the output circuit can be reduced with a simple circuit configuration.

Application Example 3

In the above-described drive circuit, a frequency of the second clock signal may be twice a frequency of the first clock signal.

It is thereby possible to realize a drive circuit with which current consumption can be reduced with a simple circuit configuration.

Application Example 4

In the above-described drive circuit, the output circuit may include a first transistor of a first conductivity type, and a second transistor and a third transistor that are of a second conductivity type. The first transistor may be connected between first potential and the output node. The second transistor and the third transistor may be connected in series between second potential and the output node. The first transistor and the second transistor may be driven based on the first clock signal. The third transistor may be driven based on the second clock signal.

It is thereby possible to realize a drive circuit with which current consumption can be reduced with a simple circuit configuration.

Application Example 5

An integrated circuit device according to this application example is an integrated circuit device including: any of the above-described drive circuits; and the charge pump circuit.

This application example includes the drive circuit with which current consumption can be reduced, and it is accordingly possible to realize an integrated circuit device with which current consumption can be reduced.

Application Example 6

A method for controlling a charge pump circuit according to this application example is a method for controlling a charge pump circuit, the method including: generating a drive clock signal for driving the charge pump circuit based on a first clock signal and a second clock signal that is a signal whose voltage level does not change in a period during which a voltage level of the first clock signal changes; and controlling, based on the second clock signal, an output node that outputs the drive clock signal, so as to be in a high impedance state, in a period before a voltage level of the drive clock signal changes.

According to this application example, the output node that outputs the drive clock signal is controlled so as to be in a high impedance state, in the period before the voltage level of the drive clock signal changes. Therefore, through-current that flows through the output circuit for generating the drive clock signal can be reduced. Accordingly, it is possible to realize the method for controlling a charge pump circuit with which current consumption can be reduced.

DESCRIPTION OF EXEMPLARY EMBODIMENTS

Hereinafter, preferable embodiments of the invention will be described in detail using the drawings. The used drawings are for convenience of the description. Note that the embodiments described below are not intended to unjustly limit the content of the invention described in the scope of claims. Not all configurations described below necessarily are essential constituent elements of the invention.

1. Drive Circuit and Integrated Circuit Device

1-1. First Embodiment

Figure 1:
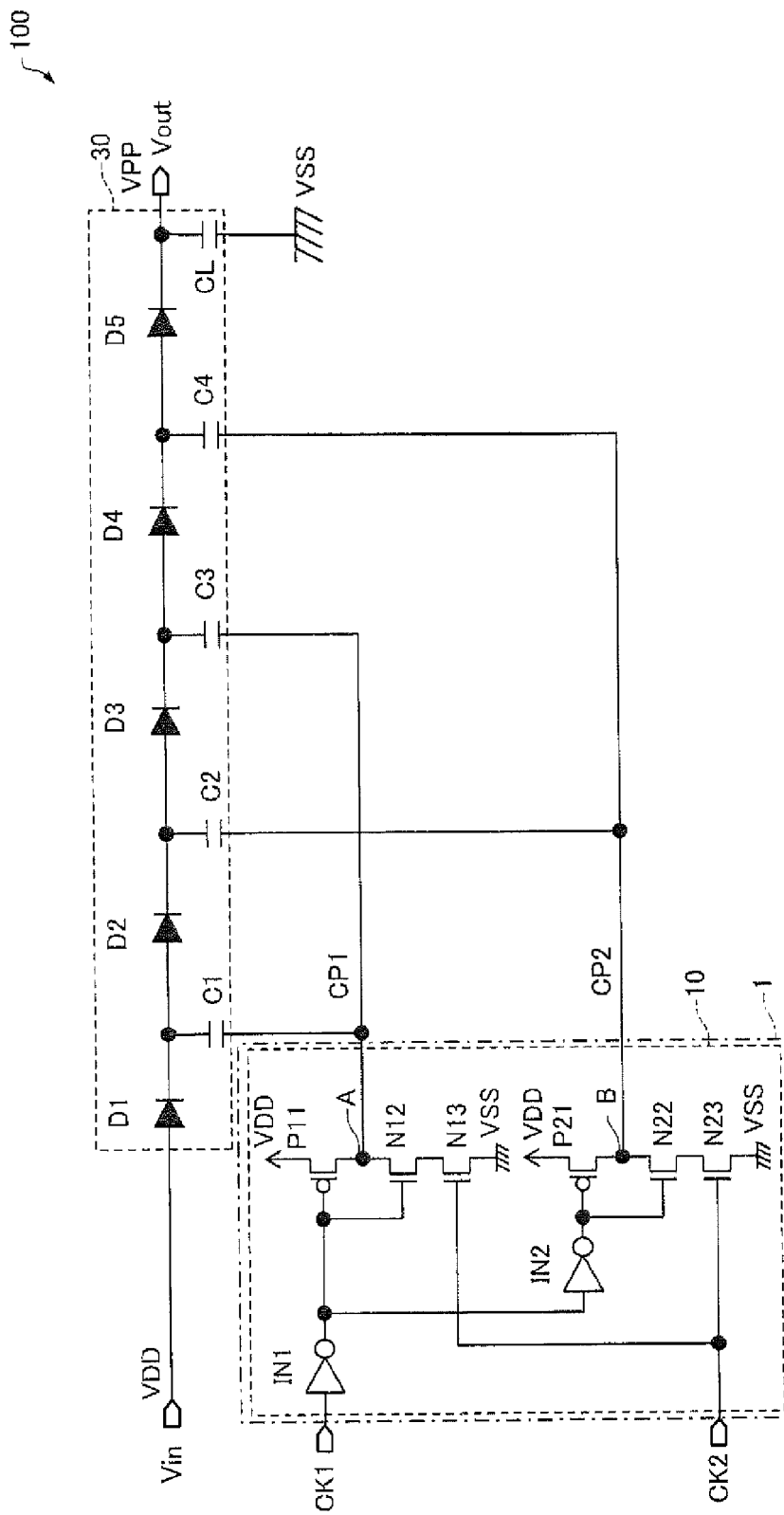
FIG. 1 is a circuit diagram of an integrated circuit device 100 according to a first embodiment.

FIG. 1 is a circuit diagram of an integrated circuit device 100 according to a first embodiment.

The integrated circuit device 100 according to the present embodiment is configured to include a drive circuit 1 and a charge pump circuit 30.

The drive circuit 1 according to the present embodiment includes an output circuit 10 having output nodes (output node A and output node B) that output, to the charge pump circuit 30, drive clock signals (drive clock signal CP1 and drive clock signal CP2) for driving the charge pump circuit 30.

The output circuit 10 is configured to include a first transistor P11 and a first transistor P21, which are of a first conductivity type, a second transistor N12 and a second transistor N22 of a second conductivity type, and a third transistor N13 and a third transistor N23, which are of the second conductivity type. In the present embodiment, the first transistor P11 and the first transistor P21 of the first conductivity type are P-channel MOSFETs. The second transistor N12, the second transistor N22, the third transistor N13, and the third transistor N23 of the second conductivity type are N-channel MOSFETs.

The first transistor P11 is connected between first potential VDD and the output node A, and the second transistor N12 and the third transistor N13 are connected in series between second potential VSS and the output node A. Note that the order of serial connection may be changed such that the third transistor N13 is arranged between the output node A and the second transistor N12.

The first transistor P21 is connected between first potential VDD and the output node B, and the second transistor N22 and the third transistor N23 are connected in series between second potential VSS and the output node B. Note that the order of serial connection may be changed such that the third transistor N23 is arranged between the output node B and the second transistor N22.

The first transistor P11, the first transistor P21, the second transistor N12, and the second transistor N22 are driven based on a first clock signal CK1, and the third transistor N13 and the third transistor N23 are driven based on a second clock signal CK2.

In the present embodiment, the output circuit 10 is configured to include an inverter IN1 and an inverter IN2. The inverter IN1 inverts the first clock signal CK1 and outputs the resultant signal to a gate of the first transistor P11, a gate of the second transistor N12, and the inverter IN2. The inverter 1N2 inverts an output signal of the inverter IN1 and outputs the resultant signal to the first transistor P21 and the second transistor N22. A second clock signal CK2 is input to gates of the third transistor N13 and the third transistor N23.

The charge pump circuit 30 is configured to include a diode D1, a diode D2, a diode D3, a diode D4, a diode D5, a capacitor element C1, a capacitor element C2, a capacitor element C3, a capacitor element C4, and a capacitor element CL. In the present embodiment, this configuration is for boosting the first potential VDD that is to be input to an input terminal Vin and obtaining output voltage VPP. Note that the charge pump circuit 30 may be configured to output negative voltage as the output voltage VPP.

The diode D1, the diode D2, the diode D3, the diode D4, and the diode D5 are connected in this order in series from the side of the input terminal Vin toward an output terminal Vout.

An end of the capacitor element C1 is connected to a cathode of the diode D1 and an anode of the diode D2, and the other end of the capacitor element C1 is connected to the output node A of the output circuit 10. An end of the capacitor element C2 is connected to a cathode of the diode D2 and an anode of the diode D3, and the other end of the capacitor element C2 is connected to the output node B of the output circuit 10. An end of the capacitor element C3 is connected to a cathode of the diode D3 and an anode of the diode D4, and the other end of the capacitor element C3 is connected to the output node A of the output circuit 10. An end of the capacitor element C4 is connected to a cathode of the diode D4 and an anode of the diode D5, and the other end of the capacitor element C4 is connected to the output node B of the output circuit 10. An end of the capacitor element CL is connected to a cathode of the diode D5 and the output terminal Vout, and the other end of the capacitor element CL is connected to the second potential VSS.

Figure 2:
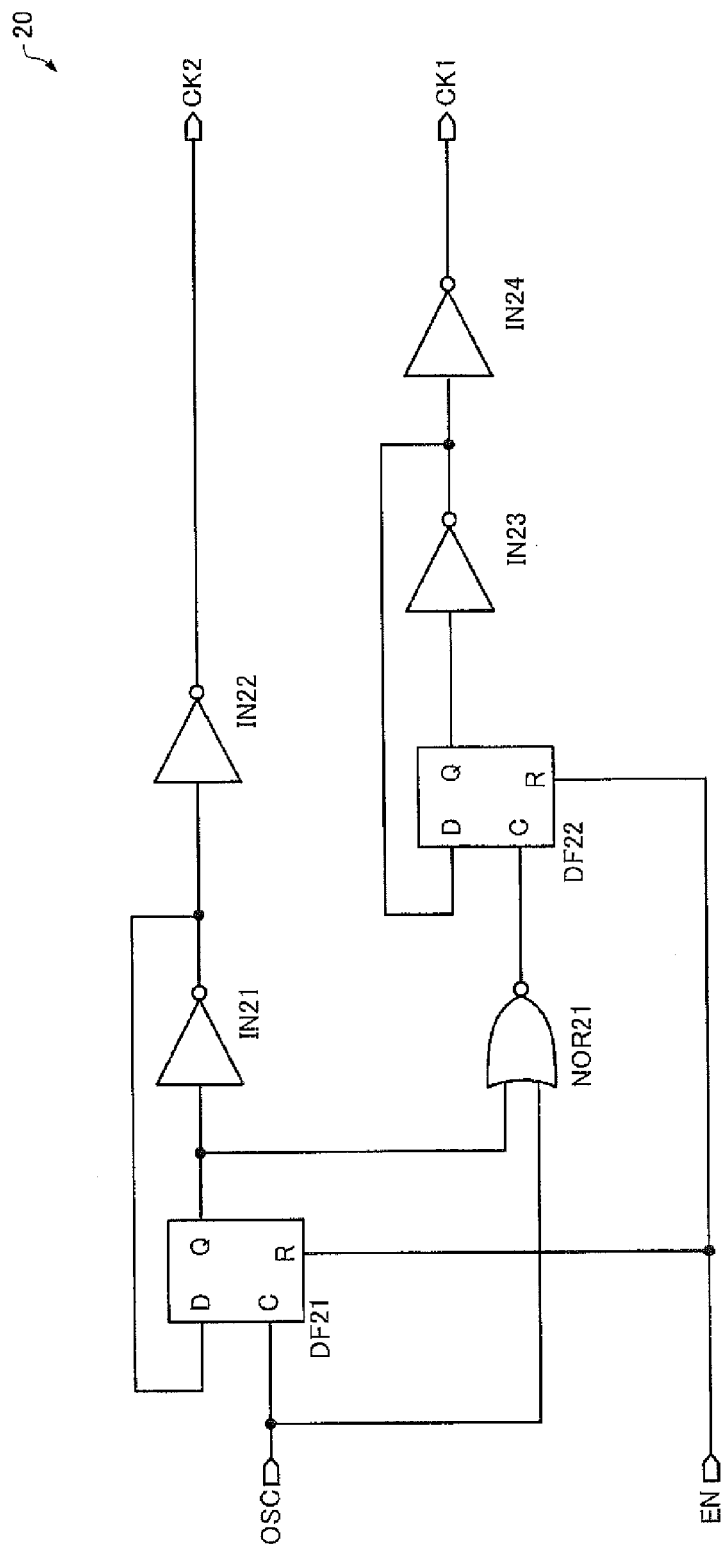
FIG. 2 is a circuit diagram showing an exemplary configuration of a clock signal generation circuit 20 that generates a first clock signal CK1 and a second clock signal CK2.

FIG. 2 is a circuit diagram showing an exemplary configuration of the clock signal generation circuit 20 that generates the first clock signal CK1 and the second clock signal CK2.

The clock signal generation circuit 20 is configured to include a flip-flop circuit DF21, a flip-flop circuit DF22, an inverter IN21, an inverter IN22, an inverter IN23, an inverter IN24, and a NOR gate circuit NOR21. The flip-flop circuit DF21 and the flip-flop circuit DF22 are D-type flip-flop circuits. The flip-flop circuits each have a C-terminal that is a clock input terminal, a D-terminal that is a data input terminal, an R-terminal that is a reset terminal, and a Q-terminal that is an output terminal. An enable signal EN is input to the R-terminals of the flip-flop circuit DF21 and the flip-flop circuit DF22.

A reference clock signal OSC is input to the C-terminal of the flip-flop circuit DF21. An output signal from the Q-terminal of the flip-flop circuit DF21 is input to the inverter IN21 and one of the input terminals of the NOR gate circuit NOR21. An output signal of the inverter IN21 is input to the inverter IN22 and the D-terminal of the flip-flop circuit DF21. The inverter IN22 outputs the second clock signal CK2.

The reference clock signal OSC is input to the other input terminal of the NOR gate circuit NOR21. An output signal of the NOR gate circuit NOR21 is input to the C-terminal of the flip-flop circuit DF22. An output signal from the Q-terminal of the flip-flop circuit DF22 is input to the inverter IN23. An output signal of the inverter IN23 is input to the inverter IN24 and the D-terminal of the flip-flop circuit DF22. The inverter IN24 outputs the first clock signal CK1.

Figure 3:
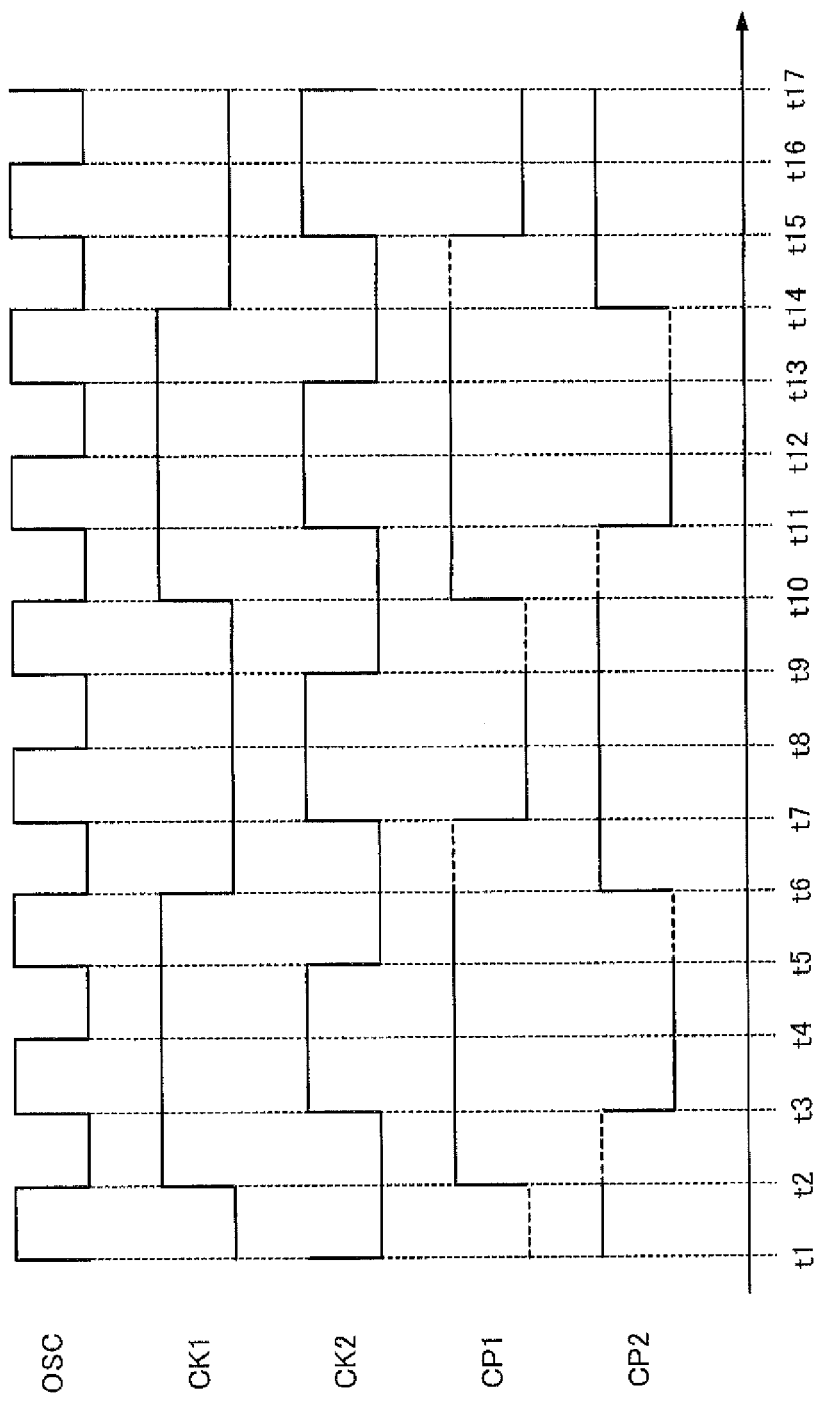
FIG. 3 is a timing chart showing exemplary operations of a drive circuit 1 and the clock signal generation circuit 20.

FIG. 3 is a timing chart showing exemplary operations of the drive circuit 1 and the clock signal generation circuit 20. FIG. 3 shows the reference clock signal OSC, the first clock signal CK1, the second clock signal CK2, the drive clock signal CP1, and the drive clock signal CP2 in this order from the top.

The clock signal generation circuit 20 divides the frequency of the reference clock signal OSC by 2 to generate the second clock signal CK2. The clock signal generation circuit 20 also generates the first clock signal CK1, which corresponds to a signal obtained by delaying the second clock signal CK2 by half a clock of the reference clock signal OSC, inverting the delayed signal, and further dividing the frequency of the inverted signal by 2. In the clock signal generation circuit 20, the output signal of the NOR gate circuit NOR21 is input to the C-terminal of the flip-flop circuit DF22, and the first clock signal CK1 is thereby generated. The second clock signal CK2 that is thus generated by the clock signal generation circuit 20 is a signal whose voltage level does not change in a period during which the voltage level of the first clock signal CK1 changes. The second clock signal CK2 is a clock signal whose frequency is higher than that of the first clock signal CK1.

The output circuit 10 generates drive clock signals (drive clock signal CP1 and drive clock signal CP2) based on the first clock signal CK1 and the second clock signal CK2 that is a signal whose voltage level does not change in a period during which the voltage level of the first clock signal CK1 changes, and controls, based on the second clock signal CK2, the output nodes (output node A and output node B) that output the drive clock signals (drive clock signal CP1 and drive clock signal CP2), so as to be in a high impedance state, in a period before the voltage levels of the drive clock signals (drive clock signal CP1 and drive clock signal CP2) change. The output circuit 10 controls the output nodes of the drive clock signals so as to be in a high impedance state, in a period during which the second clock signal CK2 is at a low level, before the voltage levels of the drive clock signals change. Note that, in FIG. 3, the periods denoted by dotted lines (e.g., a period of the drive clock signal CP1 from time t6 to time t7) indicate that the corresponding output node A or output node B is controlled so as to be in a high impedance state.

For example, in the period from time t3 to time t5 in FIG. 3, both the first clock signal CK1 and the second clock signal CK2 are at a high level. In this case, the first transistor P11 is in an ON state, the second transistor N12 is in an OFF state, the third transistor N13 is in an ON state, and the output node A outputs the drive clock signal CP1 at a high level. Meanwhile, the first transistor P21 is in an OFF state, the second transistor N22 is in an ON state, the third transistor N23 is in an ON state, and the output node B outputs the drive clock signal CP2 at a low level.

In the period from time t5 to time t6 in FIG. 3, the first clock signal CK1 is at a high level, and the second clock signal CK2 is at a low level. In this case, the first transistor P11 is in an ON state, the second transistor N12 is in an OFF state, the third transistor N13 is in an OFF state, and the output node A outputs the drive clock signal CP1 at a high level. Meanwhile, the first transistor P21 is in an OFF state, the second transistor N22 is in an ON state, the third transistor N23 is in an OFF state, and the output node B is controlled so as to be in a high impedance state.

In the period from time t6 to time t7 in FIG. 3, both the first clock signal CK1 and the second clock signal CK2 are at a low level. In this case, the first transistor P11 is in an OFF state, the second transistor N12 is in an ON state, the third transistor N13 is in an OFF state, and the output node A is controlled so as to be in a high impedance state. Meanwhile, the first transistor P21 is in an ON state, the second transistor N22 is in an OFF state, the third transistor N23 is in an OFF state, and the output node B outputs the drive clock signal CP2 at a high level.

In the period from time t7 to time t9 in FIG. 3, the first clock signal CK1 is at a low level, and the second clock signal CK2 is at a high level. In this case, the first transistor P11 is in an OFF state, the second transistor N12 is in an ON state, the third transistor N13 is in an ON state, and the output node A outputs the drive clock signal CP1 at a low level. Meanwhile, the first transistor P21 is in an ON state, the second transistor N22 is in an OFF state, the third transistor N23 is in an ON state, and the output node B outputs the drive clock signal CP2 at a high level.

In the period from time t9 to time t10 in FIG. 3, both the first clock signal CK1 and the second clock signal CK2 are at a low level. In this case, the first transistor P11 is in an OFF state, the second transistor N12 is in an ON state, the third transistor N13 is in an OFF state, and the output node A is controlled so as to be in a high impedance state. Meanwhile, the first transistor P21 is in an ON state, the second transistor N22 is in an OFF state, the third transistor N23 is in an OFF state, and the output node B outputs the drive clock signal CP2 at a high level.

In the period from time t10 to time t11 in FIG. 3, the first clock signal CK1 is at a high level, and the second clock signal CK2 is at a low level. In this case, the first transistor P11 is in an ON state, the second transistor N12 is in an OFF state, the third transistor N13 is in an OFF state, and the output node A outputs the drive clock signal CP1 at a high level. Meanwhile, the first transistor P21 is in an OFF state, the second transistor N22 is in an ON state, the third transistor N23 is in an OFF state, and the output node B is controlled so as to be in a high impedance state. From time t11 onward in FIG. 3, the operations from time t3 to time t11 are repeated.

In the above operations, there is no period during which all of the first transistor P11, the second transistor N12, and the third transistor N13 are controlled so as to be in an ON state. Accordingly, when the first transistor P11, the second transistor N12, and the third transistor N13 function as ideal switching elements, current (through-current) does not exist that flows throughout the first transistor P11, the second transistor N12, and the third transistor N13.

Furthermore, in the above operations, there is no period during which all of the first transistor P21, the second transistor N22, and the third transistor N23 are controlled so as to be in an ON state. Accordingly, when the first transistor P21, the second transistor N22, and the third transistor N23 function as ideal switching elements, current (through-current) does not exist that flows throughout the first transistor P21, the second transistor N22, and the third transistor N23.

Thus, with the drive circuit 1 according to the present embodiment, the output nodes (output node A and output node B) that output the drive clock signals (drive clock signal CP1 and drive clock signal CP2) are controlled so as to be in a high impedance state, in a period before the voltage levels of the drive clock signals (drive clock signal CP1 and drive clock signal CP2) change. For this reason, through-current that flows through the output circuit 10 can be reduced. Accordingly, it is possible to realize the drive circuit 1 with which current consumption can be reduced. Furthermore, noise caused by through-current can be reduced.

Moreover, through-current can be reduced regardless of the length of the period during which the first clock signal CK1 and the second clock signal CK2 are at a high level. For this reason, a charge transfer time in the charge pump circuit 30 can be extended by setting a long period during which the first clock signal CK1 and the second clock signal CK2 are at a high level. It is thereby possible to realize the drive circuit 1 capable of driving the charge pump circuit 30 even when the capacitance values of the capacitor elements C1 to C4 constituting the charge pump circuit 30 are large.

Furthermore, in the clock signal generation circuit 20, as a result of dividing the frequency of the reference clock signal OSC to generate the first clock signal CK1 and the second clock signal CK2, the timing relationship between the drive clock signal CP1 and the drive clock signal CP2 is maintained in terms of the order in which the voltage levels thereof change, the drive clock signal CP1 and the drive clock signal CP2 being generated by performing predetermined logical operations on the first clock signal CK1 and the second clock signal CK2, respectively. The effect of reducing through-current can be similarly achieved when the frequency of the reference clock signal OSC is changed. Accordingly, the operations of the charge pump circuit 30 can be flexibly changed by changing the frequency of the reference clock signal OSC.

In the drive circuit 1 according to the present embodiment, the output circuit 10 controls the output nodes (output node A and output node B) that output the drive clock signals (drive clock signal CP1 and drive clock signal CP2), so as to be in a high impedance state, in a period before or after a period during which the voltage level of the first clock signal CK1 changes.

With the drive circuit 1 according to the present embodiment, in a period before or after a period during which the voltage level of the first clock signal CK1 changes, the output nodes (output node A and output node B) that output the drive clock signals (drive clock signal CP1 and drive clock signal CP2) are controlled so as to be in a high impedance state. For this reason, through-current that flows through the output circuit 10 can be reduced with a simple circuit configuration.

In the drive circuit 1 according to the present embodiment, the frequency of the second clock signal CK2 may be twice the frequency of the first clock signal CK1.

It is thereby possible to realize the drive circuit 1 with which current consumption can be reduced, with a simple circuit configuration. Furthermore, the clock signal generation circuit 20 can be configured with a simple circuit configuration, such as one shown in FIG. 2.

With the drive circuit 1 shown in FIG. 1, the output circuit 10 can be configured only by adding the third transistor N13 and the third transistor N23 to an output circuit using a complementary inverter. For this reason, it is possible to realize the drive circuit 1 with which current consumption can be reduced, with a simple circuit configuration.

The integrated circuit device 100 according to the present embodiment includes the drive circuit 1 with which current consumption can be reduced. For this reason, it is possible to realize the integrated circuit device 100 with which current consumption can be reduced.

Note that, regarding the exemplary operations described using FIG. 3, an exemplary case where both the first clock signal CK1 and the second clock signal CK2 have a duty ratio of 50% has been described. However, the duty ratios of the first clock signal CK1 and the second clock signal CK2 may be appropriately set as necessary. In this case as well, a similar effect is achieved for a reason similar to that of the above-described operations.

1-2. Second Embodiment

Figure 4:
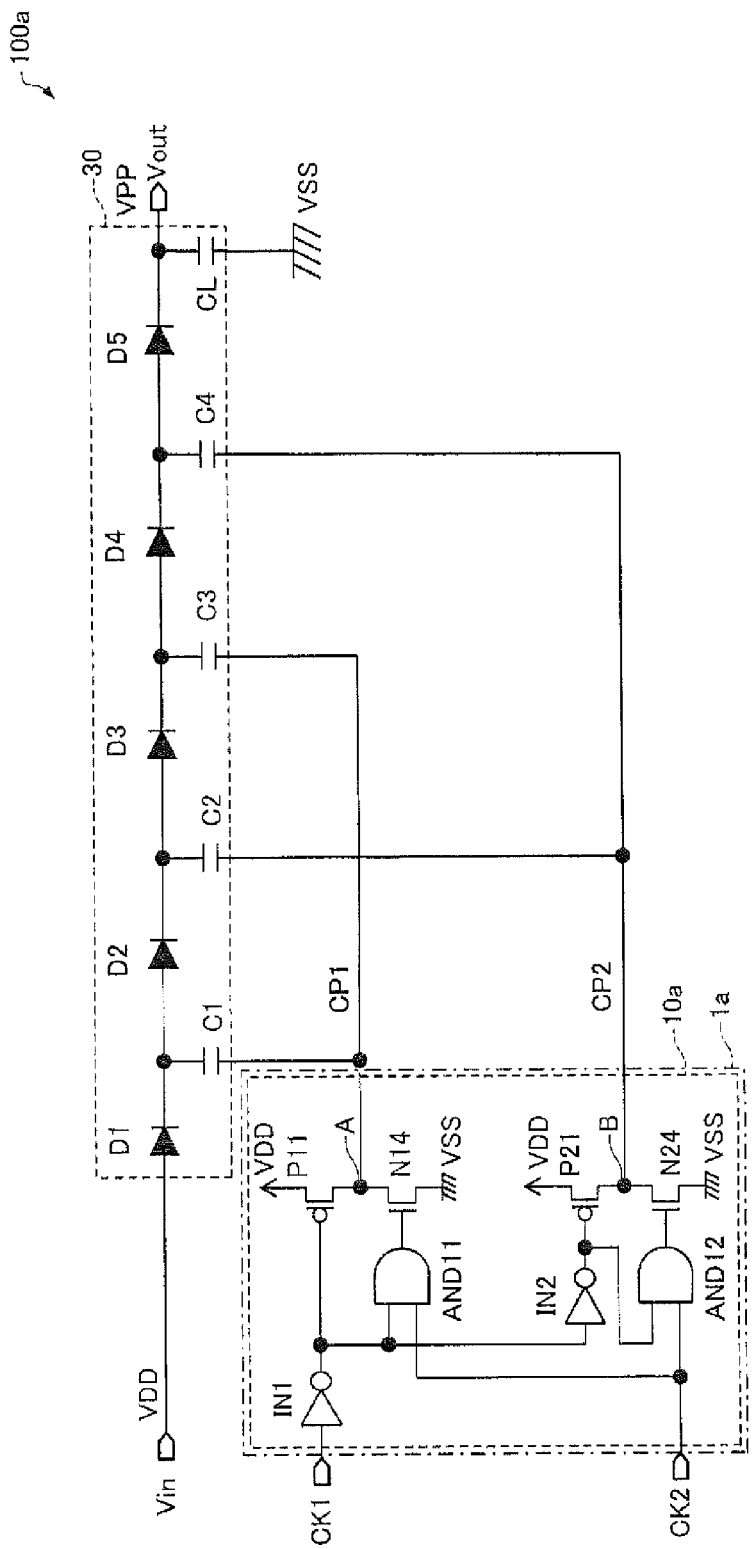
FIG. 4 is a circuit diagram of an integrated circuit device 100a according to a second embodiment.

FIG. 4 is a circuit diagram of an integrated circuit device 100a according to a second embodiment. Configurations similar to those of the integrated circuit device 100 according to the first embodiment are given the same reference numerals, and a detailed description thereof will be omitted.

The integrated circuit device 100a according to the present embodiment is configured to include a drive circuit 1a and a charge pump circuit 30. The drive circuit 1a is configured to include an output circuit 10a.

The output circuit 10a is configured to include a first transistor P11 and a first transistor P21, which are of a first conductivity type, and a second transistor N14 and a second transistor N24, which are of a second conductivity type. In the present embodiment, the first transistor P11 and the first transistor P21 of the first conductivity type are P-channel MOSFETs. The second transistor N14 and the second transistor N24 of the second conductivity type are N-channel MOSFETs.

The first transistor P11 is connected between first potential VDD and an output node A, and the second transistor N14 is connected between second potential VSS and the output node A.

The first transistor P21 is connected between first potential VDD and an output node B, and the second transistor N24 is connected between second potential VSS and an output node B.

The first transistor P11 and the first transistor P21 are driven based on a first clock signal CK1. The second transistor N14 is driven based on a logical product of an inverted signal of the first clock signal CK1 and a second clock signal CK2. The second transistor N24 is driven based on a logical product of the first clock signal CK1 and the second clock signal CK2.

In the present embodiment, the output circuit 10 is configured to include an AND gate circuit AND11 and an AND gate circuit AND12. The AND gate circuit AND11 outputs a logical product of an output signal of an inverter IN1 and the second clock signal CK2 to a gate of the second transistor N14. The AND gate circuit AND12 outputs a logical product of an output signal of an inverter IN2 and the second clock signal CK2 to the gate of the second transistor N24.

The operations of the drive circuit 1a and the clock signal generation circuit 20 according to the present embodiment are similar to those of the drive circuit 1 and the clock signal generation circuit 20 according to the first embodiment described using FIG. 3. Accordingly, with the drive circuit 1a according to the present embodiment as well, a similar effect is achieved for a reason similar to that of the drive circuit 1 according to the first embodiment. Furthermore, with the integrated circuit device 100a according to the present embodiment as well, a similar effect is achieved for a reason similar to that of the integrated circuit device 100 according to the first embodiment.

2. Method for Controlling Charge Pump Circuit

Figure 5:
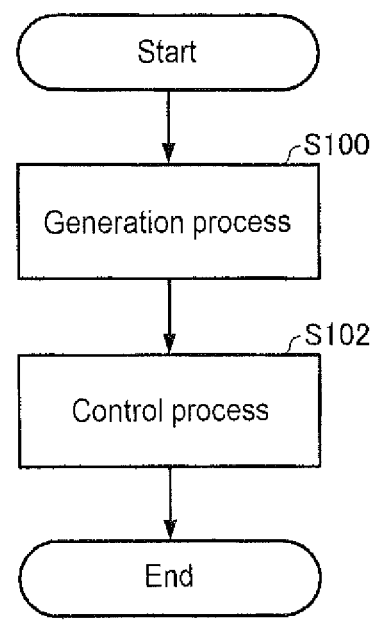
FIG. 5 is a flowchart showing an outline of a method for controlling a charge pump circuit according to the present embodiment.

FIG. 5 is a flowchart showing an outline of a method for controlling a charge pump circuit according to the present embodiment. An example of realizing the method using the drive circuit 1 according to the first embodiment will be described below.

The method for controlling the charge pump circuit 30 according to the present embodiment includes a generation step (step S100) of generating drive clock signals (drive clock signal CP1 and drive clock signal CP2) for driving the charge pump circuit 30, based on the first clock signal CK1 and the second clock signal CK2 that is a signal whose voltage level does not change in a period during which the voltage level of the first clock signal CK1 changes, and a control step (step S102) of controlling, based on the second clock signal CK2, the output nodes (output node A and output node B) that output the drive clock signals (drive clock signal CP1 and drive clock signal CP2), so as to be in a high impedance state, in a period before the voltage levels of the drive clock signals (drive clock signal CP1 and drive clock signal CP2) change.

For example, the step in which the drive circuit 1 generates the drive clock signal CP1 based on the first clock signal CK1 and the second clock signal CK2, in the period from time t2 to time t6 in FIG. 3, the period from time t7 to time t9, the period from time t10 to time t14, and the period from time t15 onward corresponds to the generation step in step S100.

The step in which the drive circuit 1 controls the output node A that outputs the drive clock signal CP1, so as to be in a high impedance state, in the period from time t1 to time t2 in FIG. 3, the period from time t6 to time t7, the period from time t9 to time t10, and the period from time t14 to time t15 corresponds to the control step in step S102. In the present embodiment, in the control step in step S102, the drive circuit 1 also controls the output node A that outputs the drive clock signal CP1, so as to be in a high impedance state, in a period before or after a period during which the voltage level of the first clock signal CK1 changes.

Also, the step in which the drive circuit 1 generates the drive clock signal CP2 based on the first clock signal CK1 and the second clock signal CK2, in the period from time t1 to time t2 in FIG. 3, the period from time t3 to time t5, the period from time t6 to time t10, the period from time t11 to time t13, and the period from time t14 onward corresponds to the generation step in step S100.

The step in which the drive circuit 1 controls the output node B that outputs the drive clock signal CP2, so as to be in a high impedance state, in the period from time t2 to time t3 in FIG. 3, the period from time t5 to time t6, the period from time t10 to time t11, and the period from time t13 to time t14 corresponds to the control step in step S102. In the present embodiment, in the control step in step S102, the drive circuit 1 also controls the output node B that outputs the drive clock signal CP2, so as to be in a high impedance state, in a period before or after a period during which the voltage level of the first clock signal CK1 changes.

With the method for controlling the charge pump circuit 30 according to the present embodiment, the output nodes (output node A and output node B) that output the drive clock signals (drive clock signal CP1 and drive clock signal CP2) are controlled so as to be in a high impedance state, in a period before the voltage levels of the drive clock signals (drive clock signal CP1 and drive clock signal CP2) change. For this reason, through-current that flows through the output circuit 10 for generating the drive clock signals (drive clock signal CP1 and drive clock signal CP2) can be reduced. Accordingly, it is possible to realize the method for controlling the charge pump circuit 30 with which current consumption can be reduced.

Furthermore, with the method for controlling the charge pump circuit 30 according to the present embodiment, the output nodes (output node A and output node B) that output the drive clock signals (drive clock signal CP1 and drive clock signal CP2) are controlled so as to be in a high impedance state, in a period before or after a period during which the voltage level of the first clock signal CK1 changes. For this reason, it is possible to realize the method for controlling the charge pump circuit 30 with a simple configuration.

Note that the method for controlling the charge pump circuit 30 according to the present embodiment can be similarly realized and a similar effect is achieved, even if the drive circuit 1a according to the second embodiment is used in place of the drive circuit 1.

Although the embodiments or modifications have been described above, the invention is not limited to these embodiments or modifications, and can be carried out in various modes without departing from the gist of the invention.

The invention includes substantially the same configurations (e.g., configurations with the same functions, methods, and results, or configurations with the same object and effect) as the configurations described in the embodiments. The invention also includes configurations in which an unessential part of the configurations described in the embodiments is replaced. The invention also includes configurations that achieve the same effect as that of the configurations described in the embodiments, or configurations that can achieve the same object as that of the configurations described in the embodiments. The invention also includes configurations obtained by adding a known technique to the configurations described in the embodiments.

The entire disclosure of Japanese Patent Application No. 2014-058593, filed Mar. 20, 2014 is expressly incorporated by reference herein.

What is claimed is:

1. A drive circuit comprising:
    an output circuit having an output node that outputs, to a charge pump circuit, a drive clock signal for driving the charge pump circuit,
    wherein the output circuit generates the drive clock signal based on a first clock signal and a second clock signal that is a signal whose voltage level does not change in a period during which a voltage level of the first clock signal changes, and controls, based on the second clock signal, an impedance of the output node so as to be up, in a period before a voltage level of the drive clock signal changes.

2. The drive circuit according to claim 1,
    wherein the output circuit controls an impedance of the output node so as to be up, in a period before or after a period during which the voltage level of the first clock signal changes.

3. The drive circuit according to claim 1,
    wherein a frequency of the second clock signal is twice a frequency of the first clock signal.

4. The drive circuit according to claim 1,
    wherein the output circuit includes a first transistor of a first conductivity type, and a second transistor and a third transistor that are of a second conductivity type,
    the first transistor is connected between first potential and the output node,
    the second transistor and the third transistor are connected in series between second potential and the output node,
    the first transistor and the second transistor are driven based on the first clock signal, and
    the third transistor is driven based on the second clock signal.

5. An integrated circuit device comprising:
the drive circuit according to claim 1; and
the charge pump circuit.

6. A method for controlling a charge pump circuit, the method comprising:
generating a drive clock signal for driving the charge pump circuit based on a first clock signal and a second clock signal that is a signal whose voltage level does not change in a period during which a voltage level of the first clock signal changes; and
controlling, based on the second clock signal, an impedance of an output node that outputs the drive clock signal, so as to be up, in a period before a voltage level of the drive clock signal changes.

* * * * *